US007479670B2

(12) United States Patent
Fix et al.

(10) Patent No.: US 7,479,670 B2
(45) Date of Patent: Jan. 20, 2009

(54) ORGANIC ELECTRONIC COMPONENT WITH HIGH RESOLUTION STRUCTURING, AND METHOD OF THE PRODUCTION THEREOF

(75) Inventors: Walter Fix, Nürnberg (DE); Ronan Martin, Lausanne (CH); Andreas Ullmann, Zirndorf (DE)

(73) Assignee: PolyIC GmbH & Co KG, Furth (DE)

( * ) Notice: Subject to any disclaimer, the term of this patent is extended or adjusted under 35 U.S.C. 154(b) by 0 days.

(21) Appl. No.: 10/569,763

(22) PCT Filed: Aug. 14, 2004

(86) PCT No.: PCT/DE2004/001816

§ 371 (c)(1),
(2), (4) Date: Jul. 24, 2006

(87) PCT Pub. No.: WO2005/022663

PCT Pub. Date: Mar. 10, 2005

(65) Prior Publication Data

US 2007/0187671 A1  Aug. 16, 2007

(30) Foreign Application Priority Data

Aug. 25, 2003  (DE) ............................. 103 39 036

(51) Int. Cl.
*H01L 23/58* (2006.01)
(52) U.S. Cl. .................. 257/244; 257/40; 257/642; 257/E23.148; 257/E22.141; 257/E21.575
(58) Field of Classification Search .................. 257/40, 257/642, E39.007, E23.148, E21.028, 244, 257/E22.141, E21.575
See application file for complete search history.

(56) References Cited

U.S. PATENT DOCUMENTS

| 3,512,052 A | 5/1970 | MacIver et al. |
| 3,769,096 A | 10/1973 | Ashkin |
| 3,955,098 A | 5/1976 | Kawamoto |

(Continued)

FOREIGN PATENT DOCUMENTS

DE  33 38 597  5/1985

(Continued)

OTHER PUBLICATIONS

U.S. Appl. No. 10/344,926, filed Feb. 12, 2004, Adolf Bernds et al.

(Continued)

*Primary Examiner*—Matthew Smith
*Assistant Examiner*—Joannie A Garcia
(74) *Attorney, Agent, or Firm*—Carella, Byrne, et al.; Elliot M. Olstein; William Squire

(57) ABSTRACT

The invention relates to an electronic component made primarily from organic materials with high resolution structuring, in particular to an organic field effect transistor (OFET) with a small source-drain distance, and to a production method thereof. The organic electronic component has depressions and/or modified regions in which the conductor tracks/electrodes, which can be metallic, for example, are arranged, and which have been produced by means of a laser during production.

10 Claims, 3 Drawing Sheets

U.S. PATENT DOCUMENTS

Figure 1:
Figure 1:
Figure 1:
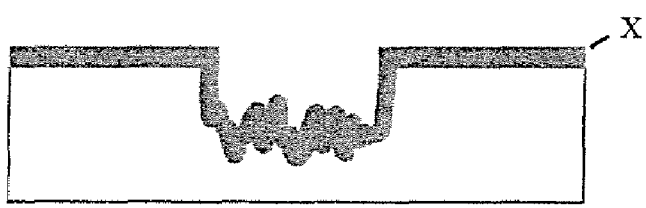
Figure 1:
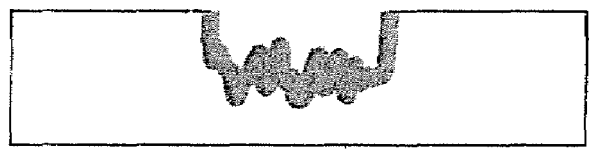

| | | | |
|---|---|---|---|
| 3,999,122 A | 12/1976 | Winstel et al. |
| 4,246,298 A | 1/1981 | Guarnery |
| 4,302,648 A | 11/1981 | Sado et al. |
| 4,340,057 A | 7/1982 | Bloch |
| 4,442,019 A | 4/1984 | Marks |
| 4,554,229 A | 11/1985 | Small |
| 4,865,197 A | 9/1989 | Craig |
| 4,926,052 A | 5/1990 | Hatayama |
| 4,937,119 A | 6/1990 | Nickles et al. |
| 5,075,816 A | 12/1991 | Stormbom |
| 5,173,835 A | 12/1992 | Cornett et al. |
| 5,206,525 A | 4/1993 | Yamamoto et al. |
| 5,259,926 A | 11/1993 | Kuwabara et al. |
| 5,321,240 A | 6/1994 | Takihira |
| 5,347,144 A | 9/1994 | Garnier et al. |
| 5,364,735 A | 11/1994 | Akamatsu |
| 5,395,504 A | 3/1995 | Hoffman et al. |
| 5,480,839 A | 1/1996 | Ezawa et al. |
| 5,486,851 A | 1/1996 | Gehner et al. |
| 5,494,781 A | 2/1996 | Ohtani et al. |
| 5,502,396 A | 3/1996 | Desarzens |
| 5,546,889 A | 8/1996 | Wakita et al. |
| 5,569,879 A | 10/1996 | Gloton |
| 5,574,291 A | 11/1996 | Dodabalapur et al. |
| 5,578,513 A | 11/1996 | Maegawa |
| 5,580,794 A | 12/1996 | Allen |
| 5,625,199 A | 4/1997 | Baumbach et al. |
| 5,629,530 A | 5/1997 | Brown et al. |
| 5,630,986 A | 5/1997 | Charlton |
| 5,652,645 A | 7/1997 | Jain |
| 5,691,089 A | 11/1997 | Smayling |
| 5,693,956 A | 12/1997 | Shi |
| 5,705,826 A | 1/1998 | Aratani et al. |
| 5,729,428 A | 3/1998 | Sakata et al. |
| 5,854,139 A | 12/1998 | Kondo et al. |
| 5,869,972 A | 2/1999 | Birch et al. |
| 5,883,397 A | 3/1999 | Isoda et al. |
| 5,892,244 A | 4/1999 | Tanaka et al. |
| 5,946,551 A | 8/1999 | Dimitrakopoulos |
| 5,967,048 A | 10/1999 | Fromson et al. |
| 5,970,318 A | 10/1999 | Choi et al. |
| 5,973,598 A | 10/1999 | Beigel |
| 5,994,773 A | 11/1999 | Hirakawa |
| 5,997,817 A | 12/1999 | Crismore et al. |
| 5,998,805 A | 12/1999 | Shi et al. |
| 6,036,919 A | 3/2000 | Thym et al. |
| 6,045,977 A | 4/2000 | Chandross et al. |
| 6,060,338 A | 5/2000 | Tanaka et al. |
| 6,072,716 A | 6/2000 | Jacobsen et al. |
| 6,083,104 A | 7/2000 | Choi |
| 6,087,196 A | 7/2000 | Sturm et al. |
| 6,133,835 A | 10/2000 | DeLeeuw et al. |
| 6,150,668 A | 11/2000 | Bao |
| 6,180,956 B1 | 1/2001 | Chondroudis |
| 6,197,663 B1 | 3/2001 | Chandross |
| 6,207,472 B1 | 3/2001 | Calligari et al. |
| 6,215,130 B1 | 4/2001 | Dodabalapur |
| 6,221,553 B1 | 4/2001 | Wolk |
| 6,251,513 B1 | 6/2001 | Rector |
| 6,284,562 B1 | 9/2001 | Batlogg et al. |
| 6,300,141 B1 | 10/2001 | Segal et al. |
| 6,321,571 B1 | 11/2001 | Themont et al. |
| 6,322,736 B1 | 11/2001 | Bao |
| 6,329,226 B1 | 12/2001 | Jones |
| 6,330,464 B1 | 12/2001 | Colvin |
| 6,335,539 B1 | 1/2002 | Dimitrakopoulos et al. |
| 6,340,822 B1 | 1/2002 | Brown et al. |
| 6,344,662 B1 | 2/2002 | Dimitrakopoulos et al. |
| 6,362,509 B1 | 3/2002 | Hart |
| 6,384,804 B1 | 5/2002 | Dodabalapur et al. |
| 6,403,396 B1 | 6/2002 | Gudesen et al. |
| 6,429,450 B1 | 8/2002 | Mutsaers et al. |
| 6,498,114 B1 | 12/2002 | Amundson et al. |
| 6,517,995 B1 | 2/2003 | Jacobson et al. |
| 6,518,949 B2 | 2/2003 | Drazic |
| 6,521,109 B1 | 2/2003 | Bartic et al. |
| 6,548,875 B2 | 4/2003 | Nishiyama |
| 6,555,840 B1 | 4/2003 | Hudson |
| 6,593,690 B1 | 7/2003 | McCormick |
| 6,603,139 B1 | 8/2003 | Tessler |
| 6,621,098 B1 | 9/2003 | Jackson |
| 6,852,583 B2 | 2/2005 | Bernds et al. |
| 6,903,958 B2 | 6/2005 | Bernds et al. |
| 6,960,489 B2 | 11/2005 | Bernds et al. |
| 7,229,868 B2 | 6/2007 | Bernds et al. |
| 2002/0018911 A1 | 2/2002 | Bernius et al. |
| 2002/0022284 A1 | 2/2002 | Heeger |
| 2002/0025391 A1 | 2/2002 | Angelopoulos |
| 2002/0053320 A1 | 5/2002 | Duthaler |
| 2002/0056839 A1 | 5/2002 | Joo et al. |
| 2002/0068392 A1 | 6/2002 | Lee et al. |
| 2002/0130042 A1 | 9/2002 | Stiene |
| 2002/0170897 A1 | 11/2002 | Hall |
| 2002/0195644 A1 | 12/2002 | Dodabalapur et al. |
| 2003/0059987 A1 | 3/2003 | Sirringhaus et al. |
| 2003/0112576 A1 | 6/2003 | Brewer et al. |
| 2003/0141807 A1 | 7/2003 | Kawase |
| 2003/0148136 A1* | 8/2003 | Yamamoto et al. ......... 428/607 |
| 2004/0002176 A1 | 1/2004 | Xu |
| 2004/0013982 A1 | 1/2004 | Jacobson et al. |
| 2004/0026689 A1 | 2/2004 | Bernds et al. |
| 2004/0084670 A1 | 5/2004 | Tripsas et al. |
| 2004/0211329 A1 | 10/2004 | Funahata et al. |
| 2007/0187671 A1 | 8/2007 | Fix et al. |

FOREIGN PATENT DOCUMENTS

| | | | |
|---|---|---|---|
| DE | 692 32 740 T2 | 4/1993 |
| DE | 424 38 32 | 6/1994 |
| DE | 198 52 312 | 5/1999 |
| DE | 198 16 860 | 11/1999 |
| DE | 199 18 193 | 11/1999 |
| DE | 198 51 703 | 5/2000 |
| DE | 100 06 257 | 9/2000 |
| DE | 199 21 024 | 11/2000 |
| DE | 199 33 757 | 1/2001 |
| DE | 695 19 782 | 1/2001 |
| DE | 199 35 527 | 2/2001 |
| DE | 199 37 262 | 3/2001 |
| DE | 100 12 204 | 9/2001 |
| DE | 100 33 112 | 1/2002 |
| DE | 100 43 204 | 4/2002 |
| DE | 100 45 192 | 4/2002 |
| DE | 100 47 171 | 4/2002 |
| DE | 100 58 559 | 5/2002 |
| DE | 100 61 297 | 6/2002 |
| DE | 101 17 663 | 10/2002 |
| DE | 101 20 687 | 10/2002 |
| DE | 101 20 686 | 11/2002 |
| DE | 102 19 905 | 12/2003 |
| EP | 0 108 650 | 5/1984 |
| EP | 0 128 529 | 12/1984 |
| EP | 0 268 370 A2 | 5/1988 |
| EP | 0 268 370 A3 | 5/1988 |
| EP | 0 350 179 | 1/1990 |
| EP | 0 418 504 | 3/1991 |
| EP | 0 442 123 | 8/1991 |
| EP | 0 460 242 | 12/1991 |
| EP | 0 501 456 A2 | 9/1992 |
| EP | 0 501 456 A3 | 9/1992 |
| EP | 0 511 807 | 11/1992 |
| EP | 0 528 662 | 2/1993 |
| EP | 0 603 939 A2 | 6/1994 |
| EP | 0 685 985 | 12/1995 |

| | | |
|---|---|---|
| EP | 0 716 458 | 6/1996 |
| EP | 0 785 578 A2 | 7/1997 |
| EP | 0 785 578 A3 | 7/1997 |
| EP | 0 786 820 | 7/1997 |
| EP | 0 615 256 | 9/1998 |
| EP | 0 690 457 | 12/1999 |
| EP | 0 962 984 | 12/1999 |
| EP | 0 966 182 | 12/1999 |
| EP | 0 979 715 | 2/2000 |
| EP | 0 981 165 | 2/2000 |
| EP | 0 989 614 A2 | 3/2000 |
| EP | 1 048 912 | 11/2000 |
| EP | 1 052 594 | 11/2000 |
| EP | 1 065 725 A2 | 1/2001 |
| EP | 1 065 725 A3 | 1/2001 |
| EP | 1 083 775 | 3/2001 |
| EP | 1 102 335 A2 | 5/2001 |
| EP | 1 103 916 | 5/2001 |
| EP | 1 104 035 A2 | 5/2001 |
| EP | 1 113 502 | 7/2001 |
| EP | 1 134 694 | 9/2001 |
| EP | 1 224 999 | 7/2002 |
| EP | 1 237 207 | 9/2002 |
| EP | 1 318 084 | 6/2003 |
| FR | 2793089 | 11/2000 |
| GB | 723598 | 2/1955 |
| GB | 2 058 462 | 4/1981 |
| JP | 54069392 | 6/1979 |
| JP | 60117769 | 6/1985 |
| JP | 61001060 | 1/1986 |
| JP | 61167854 | 7/1986 |
| JP | 62065472 A | 3/1987 |
| JP | 362065477 A | 3/1987 |
| JP | 01169942 | 7/1989 |
| JP | 2969184 | 12/1991 |
| JP | 03290976 A | 12/1991 |
| JP | 05259434 | 10/1993 |
| JP | 05347422 | 12/1993 |
| JP | 08197788 | 8/1995 |
| JP | 09083040 | 3/1997 |
| JP | 09320760 | 12/1997 |
| JP | 10026934 | 1/1998 |
| JP | 2001085272 | 3/2001 |
| WO | WO 93/16491 | 8/1993 |
| WO | WO 94/17556 | 8/1994 |
| WO | WO 95/06240 | 3/1995 |
| WO | WO 95/31831 | 11/1995 |
| WO | WO 96/02924 | 2/1996 |
| WO | WO 96/19792 | 6/1996 |
| WO | WO 97/12349 | 4/1997 |
| WO | WO 97/18944 | 5/1997 |
| WO | WO 98/18156 | 4/1998 |
| WO | WO 98/18186 | 4/1998 |
| WO | WO 98/40930 | 9/1998 |
| WO | WO 99/07189 | 2/1999 |
| WO | WO 99/10929 | 3/1999 |
| WO | WO 99/10939 | 3/1999 |
| WO | WO 99/21233 | 4/1999 |
| WO | WO 99/30432 | 6/1999 |
| WO | WO 99/39373 | 8/1999 |
| WO | WO 99/40631 | 8/1999 |
| WO | WO 99/53371 | 10/1999 |
| WO | WO 99/54936 | 10/1999 |
| WO | WO 99/66540 | 12/1999 |
| WO | WO 00/33063 | 6/2000 |
| WO | WO 00/36666 | 6/2000 |
| WO | WO 00/79617 | 12/2000 |
| WO | WO 01/03126 | 1/2001 |
| WO | WO 01/06442 | 1/2001 |
| WO | WO 01/08241 | 2/2001 |
| WO | WO 01/15233 | 3/2001 |
| WO | WO 01/17029 | 3/2001 |
| WO | WO 01/17041 | 3/2001 |
| WO | WO 01/27998 | 4/2001 |
| WO | WO 01/46987 | 6/2001 |
| WO | WO 01/47044 A2 | 6/2001 |
| WO | WO 01/47044 A3 | 6/2001 |
| WO | WO 01/47045 | 6/2001 |
| WO | WO 01/73109 A2 | 10/2001 |
| WO | WO 01/73109 A3 | 10/2001 |
| WO | WO 02/05360 | 1/2002 |
| WO | WO 0205361 | 1/2002 |
| WO | WO 02/15264 | 2/2002 |
| WO | WO 02/19443 | 3/2002 |
| WO | WO 02/29912 | 4/2002 |
| WO | WO 02/43071 | 5/2002 |
| WO | WO 02/47183 | 6/2002 |
| WO | WO 02/065557 A1 | 8/2002 |
| WO | WO 02065557 A1 | 8/2002 |
| WO | WO 02/071139 | 9/2002 |
| WO | WO 02/071505 | 9/2002 |
| WO | WO 02/076924 | 10/2002 |
| WO | WO 02/091495 | 11/2002 |
| WO | WO 02/095805 A2 | 11/2002 |
| WO | WO 02/095805 A3 | 11/2002 |
| WO | WO 02/099907 | 12/2002 |
| WO | WO 02/099908 | 12/2002 |
| WO | WO 03/036686 | 5/2003 |
| WO | WO 03/046922 | 6/2003 |
| WO | WO 03/067680 | 8/2003 |
| WO | WO 03/069552 | 8/2003 |
| WO | WO 03/081671 | 10/2003 |
| WO | WO 03/095175 | 11/2003 |
| WO | WO 2004/032257 | 4/2004 |
| WO | WO 2004/042837 | 5/2004 |
| WO | WO 2004/042837 A2 | 5/2004 |
| WO | WO 2004/042837 A3 | 5/2004 |
| WO | WI 2004/047144 A3 | 6/2004 |
| WO | WO 2004/007194 A2 | 6/2004 |
| WO | WO 2004/007194 A3 | 6/2004 |
| WO | WO 2004/047144 A2 | 6/2004 |
| WO | WO 2004/047144 A3 | 6/2004 |
| WO | WO 2004/083859 | 9/2004 |

OTHER PUBLICATIONS

U.S. Appl. No. 10/344,951, filed Feb. 12, 2004, Adolf Bernds et al.
U.S. Appl. No. 10/380,113, filed Sep. 25, 2003, Adolf Bernds et al.
U.S. Appl. No. 10/381,032, filed Feb. 12, 2004, Adolf Bernds et al.
U.S. Appl. No. 10/433,961, filed Apr. 1, 2004, Adolf Bernds.
U.S. Appl. No. 10/433,961, filed Apr. 1, 2004, Wolfgang Clemens et al.
U.S. Appl. No. 10/451,106, filed May 13, 2004, Mark Giles et al.
U.S. Appl. No. 10/467,636, filed Nov. 4, 2004, Adolf Bernds et al.
U.S. Appl. No. 10/473,050, filed May 20, 2004, Adolf Bernds et al.
U.S. Appl. No. 10/479,234, filed Dec. 30, 2004, Adolf Bernds et al.
U.S. Appl. No. 10/479,238, filed Oct. 20, 2004, Adolf Bernds et al.
U.S. Appl. No. 10/492,922, filed Mar. 3, 2005, Erwann Buillet et al.
U.S. Appl. No. 10/492,923, filed Dec. 23, 2004, Wolfgang Clemens et al.
U.S. Appl. No. 10/498,610, filed Sep. 29, 2005, Walter Fix et al.
U.S. Appl. No. 10/508,640, filed Dec. 15, 2005, Walter Fix et al.
U.S. Appl. No. 10/508,737, filed May 19, 2005, Adolf Bernds et al.
U.S. Appl. No. 10/517,750, filed Oct. 13, 2005, Wolfgang Clemens et al.
U.S. Appl. No. 10/523,216, filed Feb. 2, 2006, Adolf Bernds et al.
U.S. Appl. No. 10/523,487, Wolfgang Clemens et al.
U.S. Appl. No. 10/524,646, Walter Fix et al.
U.S. Appl. No. 10/533,756, Wolfgang Clemens et al.
U.S. Appl. No. 10/534,678, Wolfgang Clemens et al.
U.S. Appl. No. 10/535,448, W. Clemens et al.
U.S. Appl. No. 10/535,449, Walter Fix et al.
U.S. Appl. No. 10/541,815, Axel Gerlt et al.
U.S. Appl. No. 10/541,956, Wolfgang Clemens et al.
U.S. Appl. No. 10/541,957, Walter Fix et al.
U.S. Appl. No. 10/543,561, Wolfgang Clemens et al.

U.S. Appl. No. 10/542,678, Adolf Bernds et al.
U.S. Appl. No. 10/542,679, Adolf Bernds et al.
U.S. Appl. No. 10/562,989, Jurgen Ficker et al.
U.S. Appl. No. 10/562,869, Wolfram Glauert.
U.S. Appl. No. 10/569,763, Walter Fix et al.
U.S. Appl. No. 10/568,730, Wolfgang Clemens et al.
U.S. Appl. No. 10/569,233, Adolf Bernds et al.
U.S. Appl. No. 10/570,571, Clemens et al.
Angelopoulos M et al., "In-Situ Radiation Induced Doping", Mol. Crystl. Liq. Crystl., 1990, vol. 189, pp. 221-225.
Assadi A, et al:, Field-Effect Mobility of Poly (3-Hexylthiophene) Dept. of Physics and Measurement Technology, Received Mar. 3, 1988; accepted for Publication May 17, 1988.
Bao, Z. et al., "High-Performance Plastic Transistors Fabricatecd by Printing Techniques", Chem. Mater vol. 9, No. 6, 1997, pp. 1299-1301.
Bao, Z. et al. "Organic and Polymeric Materials for the Fabrications of Thin Film Field-Effect Transistors", paper presented at the meeting of American Chemical Society, Division of Polymer Chemistry, XX, XX, vol. 39, No. 1, Mar. 29, 1998.
Brabec, C.J. et al, "Photoinduced FT-IR spectroscopy and CW-photocurrent measurements of conjugated polymers and fullerenes blended into a conventional polymer matrix", Solar Energy Materials and Solar Cells, 2000 Elsevier Science V.V., pp. 19-33.
Brabec, C.J. et al., "Photovoltaic properties of a conjugated polymer/methanofullerene composites embedded in a polystyrene matrix", Journal of Applied Physics, vol. 85, No. 9, 1999, pp. 6866-6872.
Braun D., et al, "Visible light emission from semiconducting polymer diodes", American Institute of Physics, Applied Physics Letters 58, May 6, 1991, pp. 1982-1984.
Brown, A.R. et al., "Field-effect transistors made from solution-processed organic semiconductors", Elsevier Science, S.A., Synthetic Metals 88 (1997) pp. 37-55.
Brown, A.R., "Logic Gates Made from Polymer Transistors and Their Use in Ring Oscillators", Science, vol. 270, No. 10, 1995, pp. 972-974.
Chen, Shiao-Shien et al:, "Deep Submicrometer Double-Gate Fully-Depleted SOI PMOS Devices: A Concise Short-Channel Effect Threshold Voltage Model Using a Quasi-2D Approadh", IEEE Transaction on Electron Devices, vol. 43, No. 9, Sep. 1996.
Chen, X.L. et al., "Morphological and Transistor Studies of Organic Molecular Semiconductors with Anisotropic Electrical Characteristics", American Chemical Society, 2001, Chem. Mater. 2001, 13, 1341-1348.
Clemens, W. et al., "Vom Organischen Transistor Zum Plastik-Chip," Physik Journal, V. 2, 2003, pp. 31-36.
Collet J et al:, Low Voltage, 30 NM Channel Length, Organic Transistors With a Self-Assembled Monolayer as Gate Insulating Films:, Applied Physics Letters, American Institute of Physics. New York, US Bd 76, Nr. 14, Apr. 3, 2000, Seiten 1941-1943, XP000950589, ISSN:0003-6951, das ganze Dokument.
Crone, B. et al, "Large-scale complementary Integrated circuits based on Organic transistors", Nature, vol. 403, Feb. 3, 2000, pp. 521.
Dai, L. et al, Photochemical Generation of Conducting Pattersn in Polybutadiene Films:, Macromolecules, vol. 29, No. 1, 1996, pp. 282-287, XP 001042019, the whole document.
Dai, L. et al., "Conjugation of Polydienes by Oxidants Other Than Iodine", Elsevier Science S.A., Synthetic Metals 86 (1997) 1893-1894.
Dai, L. et al., "$I_2$-Doping" of 1,4-Polydienes*, Elsevier Science S.A., Synthetic Metals 69 (1995), pp. 563-566.
De Leeuw D.M. et al., "Polymeric integrated circuits and light-emitting diodes", Electron Devices Meeting, 1997. Technical Digest, International, Washington, DC, USA Dec. 7-10, 1997, New York, NY, USA, IEEE, US Dec. 7, 1997.
Dodabalapur, A. et al., Organic smart pixels, American Institute of Physics, Applied Physics Letters, vol. 73, No. 2, Jul. 13, 1998, pp. 142-144.
Drury et al., "Low-Cost All-Polymer Integrated Circuits", American Institute of Physics, Applied Physics Letters, 1998, vol. 73, No. 1, pp. 108-110, Jul. 6, 1998.

Ficker, J. et al., "Dynamic and Lifetime Measurements of Polymer OFETS and Integrated Plastic Circuits," Proc. of SPIE, v. 466, 2001, pp. 95-102.
Fix, W. et al., "Fast Polymer Integrated Circuits Based on a Polyfluorene Derivative", ESSDERC 2002, 2002, pp. 527-529.
Fix, W., et al., "Fast polymer integrated circuits", American Institute of Physics, Applied Physics Letters, vol. 81, No. 89, Aug. 2002, pp. 1735-1737.
Forrest et al.: "The Dawn of Organic Electronics", IEEE Spectrum, Aug. 2000, Seiten 29-34, XP002189000, IEEE Inc., New York, US ISSN:0018-9235, Seite 33, rechte Spalte, Zelle 58-Seite 34, linke Spalte, Zeile 24; Abbildung 5.
Fraunhofer Magazin- Polytronic Chips Von der Rolle, Apr. 2001, pp. 8-13.
Garbassi F., et al., "Bulk Modifications", Polymer Surfaces, John Wiley & Sons, 1998, pp. 289-300.
Garnier F et al:, "Vertical Devices Architecture By Molding Of Organic-Based Thin Film Transistor", Applied Physics Letters, American Institute Of Physics. XP000784120, issn: 0003-6951 abbildung 2.
Garnier, F. et al, "All-Polymer Field-Effect Transistor Realized by Printing Techniques", Science, American Association for the Advancement of Science, US, vol. 265, Sep. 16, 1994, pp. 1684-1686.
Garnier et al., "Conjugated Polymers and Oligomers as Active Material For Electronic Devices", Synthetic Metals, vol. 28, 1989.
Gelinck, G.H. et al., "High-Performance All-Polymer Integrated Circuits", Applied Physics Letters, v. 77, 2000, pp. 1487-1489.
Gosain, D.P., "Excimer laser crystallized poly-Si TFT's on plastic substrates", Second International Symposium on Laser Precision Microfabrication, May 16-18, 2001, Singapore, vol. 4426, pp. 394-400.
Halls, J.J. M., et al., "Efficient photodiodes from interpenetrating polymer networks", Nature, vol. 376, Aug. 10, 1995, pp. 498-500.
Harsanyi G. et al, "Polytronics for blogtronics:unique possibilities of polymers in biosensors and BioMEMS", IEEE Polytronic 2002 Conference, Jun. 23, 2002, pp. 211-215.
Hebner, T.R. et al., Ink-jet printing of doped polymers for organic light emitting devices:, American Institute of Physics, Applied Physics Letters, vol. 72, No. 5, Feb. 2, 1998, pp. 519-521.
Hergel, H. J.: "Pld-Progammiertechnologien", Elektronik, Franzis Verlag GMBH. Munchen, DE, Bd 41, Nr. 5, Mar. 3, 1992, Seiten 44-46, XP000293121, ISSN: 0013-5658, Abbildungen 1-3.
Hwang J D et al:, "A Vertical Submicron Slc thin film transistor", Solid State Electronics, Elsevier Science Publishers, Barking, GB, Bd. 38, NR. 2,Feb. 1, 1995, Seiten 275-278, XP004014040, ISSN:0038-1101, Abbildung 2.
IBM Technical Disclosure Bulletin, "Short-Channel Field-Effect Transistor", IBM Corp., New York, US, Bd. 32, Nr. 3A, Aug. 1, 1989, Seiten 77-78, XP000049357, ISSN:0018-8689, das ganze Dokument.
Kawase, T., et al., "Inkjet Printed Via-Hole Interconnections and Resistors for All-Polymer Transistor Circuits", Advanced Materials 2001, 13, No. 21, Nov. 2, 2001, pp. 1601-1605.
Klauk, H. et al., "Fast Organic Thin Film Transistor Circuits", IEEE Electron Device Letters, vol. 20, No. 6, pp. 289-291.
Klauk, H. et al., "Pentacene Thin Film Transistors and Inverter Circuits", 1997 International Exectron Devices Meeting Technical Digest, pp. 539-542, Dec. 1997.
Knobloch, A. et al., "Printed Polymer Transistors", Proc. Polytronic, v. 84, 2001, pp. 84-89.
Kobel W. et al., "Generation of Micropatterns in Poly (3-Methyl-Thiophene) Films Using Microlithography: A First Step in the Design of an All-Organic Thin-Film Transistor" Synthetic Metals, V. 22, 1988, pp. 265-271.
Koezuka, H. et al., "Macromolecular Electronic Device", Mol. Cryst. Liq. Cryst. 1994, vol. 2555, pp. 221-230.
Kuhlmann et al., "Terabytes in Plastikfolle", Organische Massenspeicher vor der Serienproduktion.
Kumar, Anish et al:, "Kink-Free Polycrystalline Silicon Double-Gate Elevated-Channel Thin-Film Transistors", IEEE Transactions on Electron Devices, vol. 45, No. 12, Dec. 1998.

Lidzey, D. G. et al., "Photoprocessed and Micropatterned Conjugated Polymer LEDs", Synthetic Metals, V. 82, 1996, pp. 141-148.

Lowe, J. et al., "Poly (3—(2—Acetoxyethyl)Thiophene): A Model Polymer for Acid-Catalyzed Lithography", Synthetic Metals, Elsevier Sequoia, Lausanne, CH, Bd. 85, 1997, Seiten 1427-1430.

Lu, Wen et al., "Use of Ionic Liquids for π-Conjugated Polymer Electrochemical Devices", Science, vol. 297, 2002, pp. 983-987.

Lucent Technologies, "Innovation marks significant milestone in the development of electronic paper", Cambridge, MA and Murray Hill, NJ, Nov. 20, 2000. XP-002209726.

Manuelli, Alessandro et al., "Applicability of Coating Techniques for the Production of Organic Field Effect Transistors", IEEE Polytronic 2002 Conference, 2002, pp. 201-204.

Miyamoto, Shoichi et al:, Effect of LDD Structure and Channel Poly-Si Thinning on a Gate-All-Around TFT (GAT) for SRAM's, IEEE Transactions on Electron Devices. vol. 46, No. 8, Aug. 1999.

Nalwa, H.S., "Organic Conductive Milecules and Polymers", vol. 2, 1997, pp. 534-535.

Oelkrug, D. et al., "Electronic spectra of self-organized oligothiophene films with 'standing' and 'lying' molecular units", Elsevier Science S.A., 1996, Thin Solid Films 284-270.

Qiao, X. et al., "The FeCl3-doped poly3-alkithiophenes) in solid state", Elsevier Science, Synthetic Metals 122 (2001) pp. 449-454.

Redecker, M. et al., "Mobility enhancement through homogeneous nematic alignment of a liquid-crystalline polyfluorene", 1999 American Institute of Physics, Applied Physics Letters, vol. 74, No. 10, pp. 1400-1402.

Rogers J A et al:, "Low-Voltage .01 Mum Organic Transistors and Complementary Inverter Circuits Fabricated with a Low-Cost Form of Near-Filed Photolithography", Applied Physics Letters, American Institute of Physics. New York, US, Bd. 75, Nr. 7, Aug. 16, 1999, Seiten 1010-1012, XP000934355, ISSN: 003-6951, das ganze Dokument.

Rogers, J. A. et al:, "Printing Process Suitable for Reel-to-Reel Production of High-Performance Organic Transistors and Circuits", Advanced Materials, VCH, Verlagsgesellschaft, Weinheim, DE, Bd. 11, Nr. 9, Jul. 5, 1999, Seiten 741-745, P000851834, ISSN: 0935-9648, das ganze Dokument.

Roman et al., "Polymer Diodes With High Rectification", Applied Physics Letters, vol. 75, No. 21, Nov. 22, 1999.

Rost, Henning et al., "All-Polymer Organic Field Effect Transistors", Proc. Mat. Week, CD, 2001, pp. 1-6.

Sandberg, H. et al, "Ultra-thin Organic Films for Field Effect Transistors", SPIE vol. 4466, 2001, pp. 35-43.

Schoebel, "Frequency Conversion with Organic-On-Inorganic Heterostructured Diodes", Extended Abstracts of the International Conference on Solid State Devices and Materials, Sep. 1, 1997.

Schrodner M. et al., "Plastic electronics based on Semiconducting Polymers", First International IEEE Conference on Polymers and Adhesives in Microelectronics and Photonics. Incorporating Poly, Pep & Adhesives in Electronics. Proceedings (Cat. No. 01TH8592), First International IEEE Conference on Polymers and Adhesives in Micr, Seitenn 91-94.

Shaheen, S.E., et al., "Low band-gap polymeric photovoltaic devices", Synthetic Metals, vol. 121, 2001, pp. 1583-1584.

Speakman, S.P. et al., High performance organic semiconducting thin films: Ink Jet printed polythophene [rr-P3HT], Organic Electronics 2 (2), 2001, pp. 65-73.

Takashima, W. et al., Electroplasticity Memory Devices Using Conducting Polymers and Solid Polymer Electrolytes, Polymer International, Melbourne, 1992, pp. 249-253.

Ullman, A. et al., "High Performance Organic Field-Effect Transistors and Integrated Inverters", Mat. Res. Soc. Symp. Proc., v. 665, 2001, pp. 265-270.

Velu, G. et al. "Low Driving Voltages and Memory Effect in Organic Thin-Film Transistors With A Ferroelectric Gate Insulator", Applied Physics Letters, American Institute of Physics, New York, vol. 79, No. 5, 2001, pp. 659-661.

Wang, Hsing et al., "Conducting Polymer Blends: Polythiophene and Polypyrrole Blends with Polystyrene and Poly(bisphenol A carbonate)", Macromolecules, 1990, vol. 23, pp. 1053-1059.

Wang, Yading et al., "Electrically Conductive Semiinterpenetrating Polymer Networks of Poly(3-octylthiophene)", Macromolecules 1992, vol. 25, pp. 3284-3290.

Yu, G. et al., "Dual-function semiconducting polymer devices: Light-emitting and photodetecting diodes", American Institute of Physics, Applied Physics Letter 64, Mar. 21, 1994, pp. 1540-1542.

Zangara L., "Metall Statt Helbleiter, Programmierung Von Embedded ROMS Ueber Die Metallisierungen", Elektronik, Franzis Verlag GmbH, Munchen, DE, vol. 47, No. 16, Aug. 4, 1998, pp. 52-55.

Zheng, Xiang-Yang et al., "Electrochemical Patterning of the Surface of Insulators with Electrically Conductive Polymers", J. Electrochem. Soc., v. 142, 1995, pp. L226-L227.

Zie Voor Titel Boek, de 2e Pagina,XP-002189001, p. 196-228.

Sylvie Goncalves-Conto et al, Interface Morphology in Organic Light-Emitting Diodes Adv. Materials 1999, 11, No. 2, pp. 112-115 Wiley-VCH GmbH, D-69469 Weinhein, XP-000877971.

Office Action of corresponding German application dated May 11, 2007.

U.S. Appl. No. 10/344,951, Organic Field-Effect Transistor (OFET), A Production Method Therefor, An Integrated Circuit Constructed From the Same and Their Uses, Adolf Bernds et al.

U.S. Appl. 10/362,932, Organic Field Effect Transistor, Method for Structuring and OFET and Integrated Circuit, Adolf Bernds et al.

U.S. Appl. No. 10/380,113, Organic Rectifier, Circuit, RFID Tag and Use of an Organic Rectifier, Adolf Bernds et al.

U.S. Appl. No. 10/381,032, Electrode and/or Conductor Track for Organic Components and Production Method Thereof, Adolf Bernds et al.

U.S. Appl. No. 10/433,959, Organic Field Effect Transistor, Method For Structuring an OFET and Integrated Cricuit, Adolf Bernds.

U.S. Appl. No. 10/433,961 Device For Detecting and/or Transmitting at Least One Environmental Influence, Method for Producing Said Device and Use Thereof, Wolfgang Clemens et al.

U.S. Appl. No. 10/467,636, Organic Field Effect Transistor With a Photostructured Gate Dielectric, Method for the Production and Use Thereof in Organic Electronics, Adolf Bernds et al.

U.S. Appl. No. 10/473,050, Device With At Least Two Organic Electronic Components and Method for Producing the Same, Adolf Bernds et al.

U.S. Appl. No. 10/479,234, Organic Field Effect Transistor, Method for Production and Use Thereof in the Assembly of Integrated Circuits, Adolf Bernds et al.

U.S. Appl. No. 10/479,238, Method For Producing Conductive Structures by Means of Printing Technique, and Active Components Prodcued Therefrom For Integrated Circuits, Adolf Bernds et al.

U.S. Appl. No. 10/492,922, Insulator for An Organic Electronic Component, Erwann Guillet et al.

U.S. Appl. No. 10/492,923, Electronic Unit, Circuit Design for the Same and Production Method, Wolfgang Clemens et al.

U.S. Appl. No. 10/498,610, Organic Field Effect Transistor with Offset Threshold Voltage and the Use Thereof, Walter Fix et al.

U.S. Appl. No. 10/508,640, Logic Component Comprising Organic Field Effect Transistors, Walter Fix et al.

U.S. Appl. No. 10/508,737, Device and Method for Laser Structuring Functional Polymers and, Adolf Bernds et al.

U.S. Appl. No. 10/517,750, Substrate for an Organic Field Effect Transistor, Use of the Substrate, Method of Increasing the charge Carrier Mobility and organic Field Effect Transistor (OFET), Wolfgang Clemens et al.

U.S. Appl. No. 10/523,216, Electronic Component Comprising Predominantly Organic Functional Materials And A Process For The Production Thereof, Adolf Bernds et al.

U.S. Appl. No. 10/523,487, Electronic Device, Wolfgang Clemens et al.

U.S. Appl. No. 10/524,646 Organic Component for Overvoltage Protection and Associated Circuit, Walter Fix et al.

U.S. Appl. No. 10/533,756, Ogranic Electronic Component with High-Resolution Structuring and Process for the Production Thereof, Wolfgang Clemens et al.

U.S. Appl. No. 10/534,678, Measuring Apparatus for Determining and Analyte in a Liquid Sample, Wolfgang Clemens et al.

U.S. Appl. No. 10/535,448, Organic Electronic Component Comprising Semi-Conductive Functional Layer and Method for Producing Said Component, Wolfgang Clemens et al.

U.S. Appl. No. 10/535,449, Organic Electronic Component Comprising the Same Organic Material for at Least Two Functional Layers, Adolf Bernds et al.

U.S. Appl. No. 10/344,926, An Electronic Circuit Having an Encapsulated Organis-Electronic Component, and a Method for Making an Encapsulated Organic-Electronic Component, Wolgang Clemens et al.

U.S. Appl. No. 10/541,815, Organo-Resistive Memory Unit, Axel Gerlt et al.

U.S. Appl. No. 10/541,956, Board or Substrate for an Organic Electronic Device and Use Thereof, Wolfgang Clemens, Wolfgang Clemens et al.

U.S. Appl. No. 10/541,957, Organic Field Effect Transistor And Intergrated Circuit, Walter Fix et al.

U.S. Appl. No. 10/543,561, Organic Storage Components and Corresponding Triggering Circuit, Wolfgang Clemens et al.

U.S. Appl. No. 10/542,678, Organic Electronic Components and Method For Producing Organic Electronic Devices, Adolf Bernds et al.

U.S. Appl. No. 10/542,679, Use of Conductive Carbon Black/Graphite Mixtures for the Production of Low-Cost Electronics, Adolf Bernds et al.

U.S. Appl. No. 10/562,989, Method and Device for Patterning Organic Layers, Jurgen Ficker.

U.S. Appl. No. 10/562,869, Logic Gate With a Potential-Free Gage Electrode for Organic Integrated Circuits, Wolfram Glauert.

U.S. Appl. No. 10/569,763, Organic Electronic Components With High Resolution Structuring and Method For The Production Thereof, Walter Fix.

U.S. Appl. No. 10/568,730, Organic Capacitor With Voltage-Controlled Capacitance, Wolfgang Clemens.

U.S. Appl. No. 10/569,233, Polymer mixtures for printed polymer electronic circuits, Adolf Bernds.

U.S. Appl. No. 10/570,571, Mechanical Control Elements For Organic Polymer Electronic Devices, Wolfgang Clemens.

* cited by examiner

A

A1

A2

A3

X

A4

B

B1

B2

B3

X

B4

Y

B5

B6

C

C1

C2

C3

X

C4

Y
X

C5

ORGANIC ELECTRONIC COMPONENT WITH HIGH RESOLUTION STRUCTURING, AND METHOD OF THE PRODUCTION THEREOF

The invention relates to an organic electronic component with high resolution structuring, in particular to an organic field effect transistor (OFET) with a low source-drain distance and a method of production capable of mass production.

The switching frequency and/or the switching speed of integrated digital circuits is decisively influenced not least by the channel length "l". There has thus been no lack of attempts to keep this channel length as small as possible, that is to say to provide a chip for an organic electronic component with structuring resolved to the highest possible degree.

Organic electronic components, in particular OFETs with high resolution structuring and a small source-drain distance "l" are known. However, to date these have been produced in complicated process steps that are associated with high costs. These process steps are uneconomic and regularly comprise photolithography, depressions in a lower layer or in the substrate being produced photolithographically such that a conductor track with the required capacity can be formed. These depressions are trough-shaped and do not have sharp contours. The bottom of these depressions remains unchanged.

It is true that a high resolution printing method in which the conductor tracks are introduced into depressions, and which can be applied on a large scale is known from DE 10061297.0, but there is the disadvantage that the depressions which are formed by the application of an embossing die, do not have steep wall surfaces and sharply drawn edges, but are formed more in a trough-shaped fashion and without sharp contours. As a consequence of these soft transitions, the material introduced into the depression does not, to be accurate, fill only the depression, but it is smeared around the depression and therefore leads to leakage currents. Consequently, the smeared material also cannot be wiped off without a large portion of the material being wiped out of the depression again.

It is an object of the invention to provide an electronic component which can be produced on a large scale and advantageously, and which is made from primarily organic material, in particular an OFET with a high resolution structure and a small source-drain distance.

The object and subject matter of the invention are achieved as an electronic component made from primarily organic material, comprising a substrate, at least one conductor track and/or electrode, in which the at least one conductor track and/or electrode is made from conductive material and applied to a supporting surface, the surface of which is modified and/or roughened by laser treatment.

Moreover, the subject matter of the invention is an organic electronic component in which at least one conductor track and/or one electrode is arranged in a depression of a lower layer, wherein the depression has been produced by means of a laser, that is to say it has steep walls, sharp contours and a rough bottom surface.

Finally, the subject matter of the invention is a method for producing an organic electronic component in which, in order to produce a conductor track and/or an electrode, a lower layer and/or the substrate are/is treated with a laser such that at least one depression and/or one modified region are/is to be found in a lower layer and/or the substrate, the depression having steep walls, sharp contours and a rough surface at the bottom.

According to one embodiment of the invention, the distance "l" between two electrodes or between an electrode and a conductor track is smaller than 20 µm. This corresponds to a high resolution of the structuring, which is particularly preferably even below 10 µm, in particular even fewer µm. Owing to the invention, leakage currents between the conductor tracks and/or electrodes are avoided, and the distance "l" there between can therefore be minimized.

According to one embodiment of the method, superfluous conductive material is mechanically removed in a process step following the application of the material and/or the filling of depressions with this material, that is to say wiped off, for example, without again removing an appreciable amount of conductive material from the roughened region and/or from the depression with the roughened bottom.

Applying the conductive material and/or filling the depressions can be performed using a variety of techniques: vapor deposition, sputtering, spraying, applying a doctor blade, injection, coating, printing or some other way according to the invention of applying and/or introducing.

According to one embodiment of the method, the lower layer and/or the substrate is treated with a pulsed laser, for example with pulse lengths of a few 10 ns. A few pulses can already be sufficient in this case.

The modified and/or roughened regions and/or depressions produced by laser structuring are distinguished in that the supporting surface for the conductive material is treated with a laser. Consequently, modified regions and/or depressions that are produced with lasers differ from the regions and/or depressions that have not been treated, or have been treated by embossing, for example, it being impossible, in the latter case, for the superfluous conductive material that is distributed around the depression to be wiped off without large losses.

For the case in which the work function (referred to the semiconductor) of the conductive material is suitable for the planned electronic component, the superfluous material is simply removed on the regions, not changed by laser, of the lower layer and/or the substrate, for example mechanically (by wiping with cloths and/or a rubber roll) and the structuring is terminated.

If the work function is not tuned to the semiconductor, it is additionally possible, for example, to apply a poorly conducting layer whose excess can likewise be removed again with a mechanical method. The combination of these two conductive layers as electrode or as conductor track is now of high conductivity and has the appropriate work function.

The structuring of the lowermost (lower) conductive layer (layers) can be performed in terms of time immediately after their application, and it can also be performed at the same time as the structuring of the upper layers.

The structuring of the lower layers can likewise be performed subsequently, after the structuring of the upper conductive layers (for example an upper layer already structured can be used as etching resistance).

The term "conductive material" is not to be restricted in any way here, since entirely different types of conductive materials have already been successfully used at this juncture.

A metal, an alloy, a metal paste or an organic conductive compound, for example, can be vapor deposited, sputtered on or applied with a doctor blade or applied in some other way as conductive material. The only decisive point is that the introduced conductive material adhere to the surface roughened by the laser.

Named as preferred metals are silver, gold, aluminum, copper, etc. as well as any desired mixtures, alloys of these components that can be applied in gaseous form, or liquid form as ink or metal paste (metal particles in a liquid medium), and also as a solid.

PANI, PEDOT and carbon black are preferred organic materials that can precisely also be combined with a lower conductive layer, for example made from metal.

"Modified" is used here for regions of a lower layer or of a substrate that are changed by laser treatment.

The invention is further explained below in more detail with the aid of three FIG. that reproduce by way of example and schematically how a conductor track/electrode is produced according to the invention when seen in cross section.

Figure 2:
Figure 2:
Figure 2:
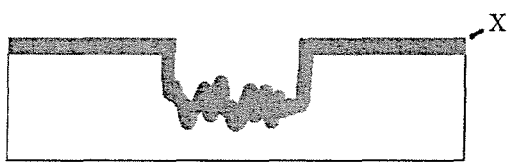
Figure 2:
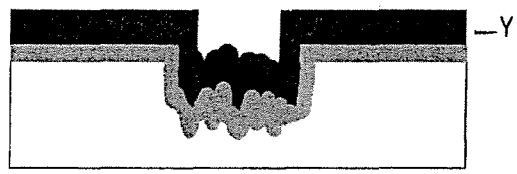
Figure 2:
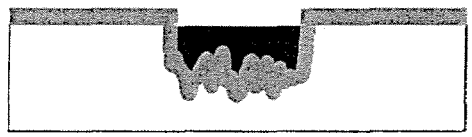
Figure 2:
Figure 3:
Figure 3:
Figure 3:
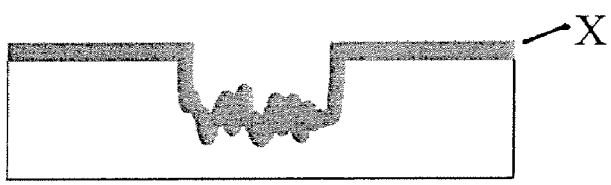
Figure 3:
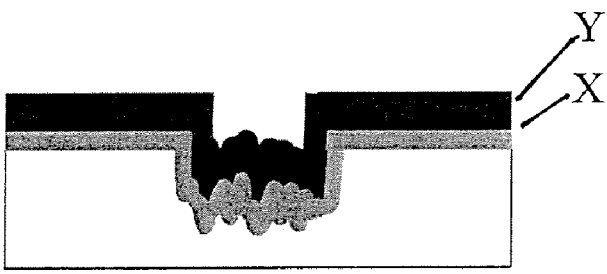
Figure 3:
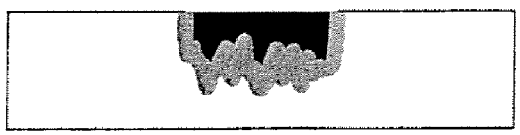

FIGS. 1 to 3 show a substrate and/or a lower layer that are treated by a method according to the invention.

FIGS. 1A1, 2B1, and 3C1 show a cleaned substrate or a cleaned lower layer. This is firstly modified by laser treatment such that a region is produced which has a modified and/or roughened surface and/or a depression (FIGS. 1A2, 2B2, and 3C2). It is also possible for the laser treatment to remove an existing roughness of the surface, and therefore for the modified region to be less rough than that not modified by laser treatment.

In accordance with FIGS. A2, B2 and C2, however, the roughness of the modified regions is greater than that of the unmodified ones.

Conductive material is applied over a large area in the following process FIGS. 1A3, 2B3 and 3C3.

Thereafter, the superfluous material is removed and preferably sharply delineated regions in which conductive material is introduced and/or applied are formed together with others, which are free from conductive material (see FIG. 1A4).

In accordance with the embodiment B, in process step B4 yet a further conductive layer, for example made from organic material or functional polymer is applied (Y) to the still unstructured highly conductive, for example metallic, layer. This further conductive layer can now be removed mechanically (FIG. 2B5). If the highly conductive layer cannot be removed mechanically (structured), a different type of method (for example chemical) is selected after process step B5 in order to structure the highly conductive layer. The highly conductive layer (x) is covered at the "modified" or roughened positions and cannot be removed here (B5). The combination of the highly conductive (for example metallic) layer and the conductive (for example polymeric) layer is present in structured form in (B6) after the chemical structuring (for example an etching process).

A further conductive layer is likewise applied at FIG. 3C4, and subsequently the two conductive layers are mechanically structured (FIG. 3C5).

The process according to the invention can be used to produce conductive structures which:

- consist of a number of layers (of different conductivity) in order, for example, to ensure the matching work function,
- are highly conductive or highly conductive in the "packet",
- are cost-effective, since only a few (3, 4, 5) process steps are required,
- have the required resolution (smallest possible structure), and
- are based on a process that is fast and capable of mass production.

The advantages also reside in the simple production method, since only 3 process steps are required (for example laser structuring, application of conductive layer, structuring of the conductive layer). For example, it is possible by using metallic conductors (solid or liquid) once again in combination with further conductors made from organic material, for example, to produce very highly conductive small structures without a voltage drop along the conductor tracks becoming problematical. In addition, the work function can be matched. The circuit size can be minimized using this technique, as a result of which the costs are likewise reduced to the same extent.

The substrate is, for example, drawn through between a number of rolls using the roll-to-roll method. Depressions and/or modified or roughened regions in the substrate or a lower layer are then produced through a mask in the first working step with the aid of a laser, for example an excimer laser. If appropriate, the excimer laser is equipped with optical lens systems such that the depressions/regions are not necessarily imaged with the same size as prescribed by the mask.

Any conductive material possibly present between the depressions/regions is removed during mechanical structuring with the aid of a suction roll using the roll-to-roll method, for example. For example, the roll rotates more slowly than the other rolls so that wiping is done effectively.

The term "organic material" or "functional material" or "(functional) polymer" here comprises all types of organic, organometallic and/or organic/inorganic polymers (hybrids), in particular those that are denoted in English, for example, as "plastics". All types of substances are involved, with the exception of the semiconductors, which form the classic diodes (germanium, silicon). Consequently, no restriction in a dogmatic sense to organic material as material containing carbon is envisaged, but rather the wide use of silicones, for example, is also held in mind. Furthermore, the term is not intended to be subject to any restriction with regard to molecule size, in particular to polymeric and/or oligomeric materials, but the use of small molecules is also entirely possible. The word component "polymer" in functional polymer is historically conditioned and to that extent says nothing about the presence of an actually polymeric compound.

The invention presents for the first time a method with the aid of which an organic electronic component such as an OFET, which can by all means also comprise metallic components and layers, can be produced with a high switching speed and high reliability in an economic fashion. It has emerged that depressions and/or regions that are produced with a laser respond differently to the application of conductive organic material than do the conventional depressions/structurings, and that therefore conductor tracks of organic and metallic nature can be produced more quickly and more effectively with this method than using other methods.

The invention claimed is:

1. An electronic component made from primarily organic material, comprising:
    an electrically insulating substrate and/or lower layer having a depression formed by a laser; and
    at least one electrical conductor track and/or electrode in the depression, the depression having steep walls, sharp contours and a relatively rough bottom surface, the at least one conductor track and/or electrode comprising at least one electrically conductive material for interconnecting electrical components on the substrate.

2. The electronic component as claimed in claim 1, having at least two conductor tracks and at least two electrically conductive electrodes and a distance l smaller than 10 μm between the two conductor tracks, the at least two electrodes and/or between a conductor track and an electrode.

3. The electronic component as claimed in claim 1 wherein the conductor track and/or electrode comprises at least one metallic layer or metal alloy layer.

4. The electronic component as claimed in claim 1 wherein at least one layer of the conductor track is organic material.

5. A method for producing an organic electronic component with a conductor track or electrode, the component having an insulating lower layer and/or a substrate, the method comprising treating the lower layer and/or substrate with a laser such that at least one depression and/or one modified region are formed in the lower layer and/or the substrate, then filling the depression and/or modified region with an electrically conductive material to thereby produce the conductor track and/or electrode from the electrically conductive material for interconnecting electrical components.

6. The method as claimed in claim 5, including the step of mechanically structuring the electrically conductive material.

7. The method as claimed in claim 5 in which superfluous electrically conductive material is produced, the method including wiping off the superfluous conductive material in a process step following the application of the layer.

8. The method as claimed in claim 6 including forming the at least one depression and/or one modified region with a pulsed laser.

9. The method as claimed in claim 6 which is carried out in a continuous roll-to-roll process.

10. The method as claimed in claim 5 wherein the electrically conductive material is metallic.

* * * * *